United States Patent
Schuster et al.

(10) Patent No.: US 9,851,422 B2
(45) Date of Patent: Dec. 26, 2017

(54) SHIM COIL ARRANGEMENT WITH INTEGRATED SPACERS

(71) Applicants: Johann Schuster, Oberasbach (DE); Lothar Schön, Neunkirchen (DE); Stefan Stocker, Großenseebach (DE); Axel vom Endt, Erlangen (DE)

(72) Inventors: Johann Schuster, Oberasbach (DE); Lothar Schön, Neunkirchen (DE); Stefan Stocker, Großenseebach (DE); Axel vom Endt, Erlangen (DE)

(73) Assignee: Siemens Aktiengesellschaft, Münich (DE)

( * ) Notice: Subject to any disclaimer, the term of this patent is extended or adjusted under 35 U.S.C. 154(b) by 901 days.

(21) Appl. No.: 13/957,394

(22) Filed: Aug. 1, 2013

(65) Prior Publication Data
US 2014/0035585 A1  Feb. 6, 2014

(30) Foreign Application Priority Data
Aug. 1, 2012 (DE) .................. 10 2012 213 597

(51) Int. Cl.
G01R 33/38 (2006.01)
G01R 33/381 (2006.01)
G01R 33/3875 (2006.01)

(52) U.S. Cl.
CPC ....... G01R 33/381 (2013.01); G01R 33/3802 (2013.01); G01R 33/3875 (2013.01); Y10T 29/4913 (2015.01)

(58) Field of Classification Search
CPC .............. G01R 33/381; G01R 33/3875; G01R 33/3802; G01R 33/389; G01R 33/58; G01R 33/56563; G01R 33/34007; Y10T 29/4913
See application file for complete search history.

(56) References Cited

U.S. PATENT DOCUMENTS

| | | |
|---|---|---|
| 5,773,976 A | 6/1998 | Sakakura et al. |
| 6,943,551 B2 | 9/2005 | Eberler et al. |
| 7,368,915 B2 | 5/2008 | Schuster et al. |
| 2007/0144867 A1* | 6/2007 | Torashima ............ B81B 3/0078 198/346.1 |
| 2012/0317795 A1* | 12/2012 | Fath .................... G01R 33/3858 29/605 |

FOREIGN PATENT DOCUMENTS

| | | | |
|---|---|---|---|
| DE | 102 46 363 A1 | 4/2004 | |
| DE | 10315539 A1 * | 10/2004 | ........... G01R 33/385 |

(Continued)

OTHER PUBLICATIONS

Official Translation of Kolbeck et al. (DE 10315539 A1).*
(Continued)

Primary Examiner — David M Gray
Assistant Examiner — Laura Roth
(74) Attorney, Agent, or Firm — Lempia Summerfield Katz LLC

(57) ABSTRACT

A shim coil arrangement is provided for a magnetic resonance tomography system. The shim coil arrangement includes a printed circuit board, a plurality of spacers, and at least one shim coil. The plurality of spacers are arranged on the printed circuit board. The at least one shim coil is arranged on the printed circuit board.

10 Claims, 5 Drawing Sheets

(56) References Cited

FOREIGN PATENT DOCUMENTS

| | | |
|---|---|---|
| DE | 10315539 A1 | 10/2004 |
| DE | 103 14 215 B4 | 11/2006 |
| DE | 10 2005 025 340 B3 | 3/2007 |

OTHER PUBLICATIONS

German Office Action dated Feb. 6, 2013 for corresponding German Patent Application No. DE 10 2012 213 597.9 with English translation.
German Office Action for corresponding German Application No. 10 2012 213 597.9, dated Feb. 4, 2015, with English Translation.

* cited by examiner

SHIM COIL ARRANGEMENT WITH INTEGRATED SPACERS

This application claims the benefit of DE 10 2012 213 597.9, filed on Aug. 1, 2012, which is hereby incorporated by reference.

BACKGROUND

The present embodiments relate to a shim coil arrangement with spacers.

Magnetic resonance devices (e.g., MRTs or MRI scanners) for examining objects or patients through magnetic resonance tomography are known, for example, from DE10314215B4.

A known gradient coil system for a magnetic resonance imaging (MRI) scanner includes, for example, three primary coil layers that are capable of generating electromagnetic fields in the three spatial directions x, y, z. The coil layers are, for example, arranged concentrically on a cylinder surface. Three further secondary coil layers are located, for example, at a radial distance. The three further secondary coil layers have the task of generating an opposing field, and thus screening the field components directed outwards as far as possible. Cooling levels through which water flows are located between these coil layers in order to take away the dissipated power deposited in the system. An active shim system between primary and secondary coils may optionally be provided. The active shim system serves to improve the homogeneity of the basic magnetic field of the MRT. This active shim system includes a number of layers of copper coils to which direct current is applied. The complete prefabricated gradient coil structure is impregnated in a vacuum, for example, with a molding resin, and this is hardened. A number of layers of shim coils may be accommodated electrically insulated radially from one another in the space between primary and secondary gradient coils and may be impregnated as completely and error-free as possible with molding resin.

Previously, in accordance with a known method, a single shim layer may be fabricated from a basic material for printed circuit boards. This may include an epoxy-glass laminate, for example, that is glued in a single layer to a copper film of the appropriate thickness. The pre-calculated conductor track structure is manufactured by process acts like those used for circuit board fabrication in an etching process.

Another known method includes winding the desired conductor structure from a round or flat wire into a winding plate and gluing the winding plate to an insulation carrier layer. The carrier layer of the conductor structure possesses a smooth, flat surface in relation to the conductor structure. When a shim board or another smooth surface comes into contact with the carrier layer as a next layer, a defined distance between these concentric surfaces is provided, so that the molding/impregnating resin may completely fill the space between the concentric surfaces.

The distance between the individual shim coil layers and an error-free impregnation is defined, for example, by individual or interconnected rods made from an electrically-insulating material, holes/cutouts in the GFK carrier plate between the conductor tracks (cf., DE102005025340), and circumferential windings with plastic sleeves spaced close to one another.

SUMMARY

The scope of the present invention is defined solely by the appended claims and is not affected to any degree by the statements within this summary.

The present embodiments may obviate one or more of the drawbacks or limitations in the related art. For example, an arrangement of shim coils in a magnetic resonance tomography (MRT) device is optimized.

DETAILED DESCRIPTION

Figure 6:
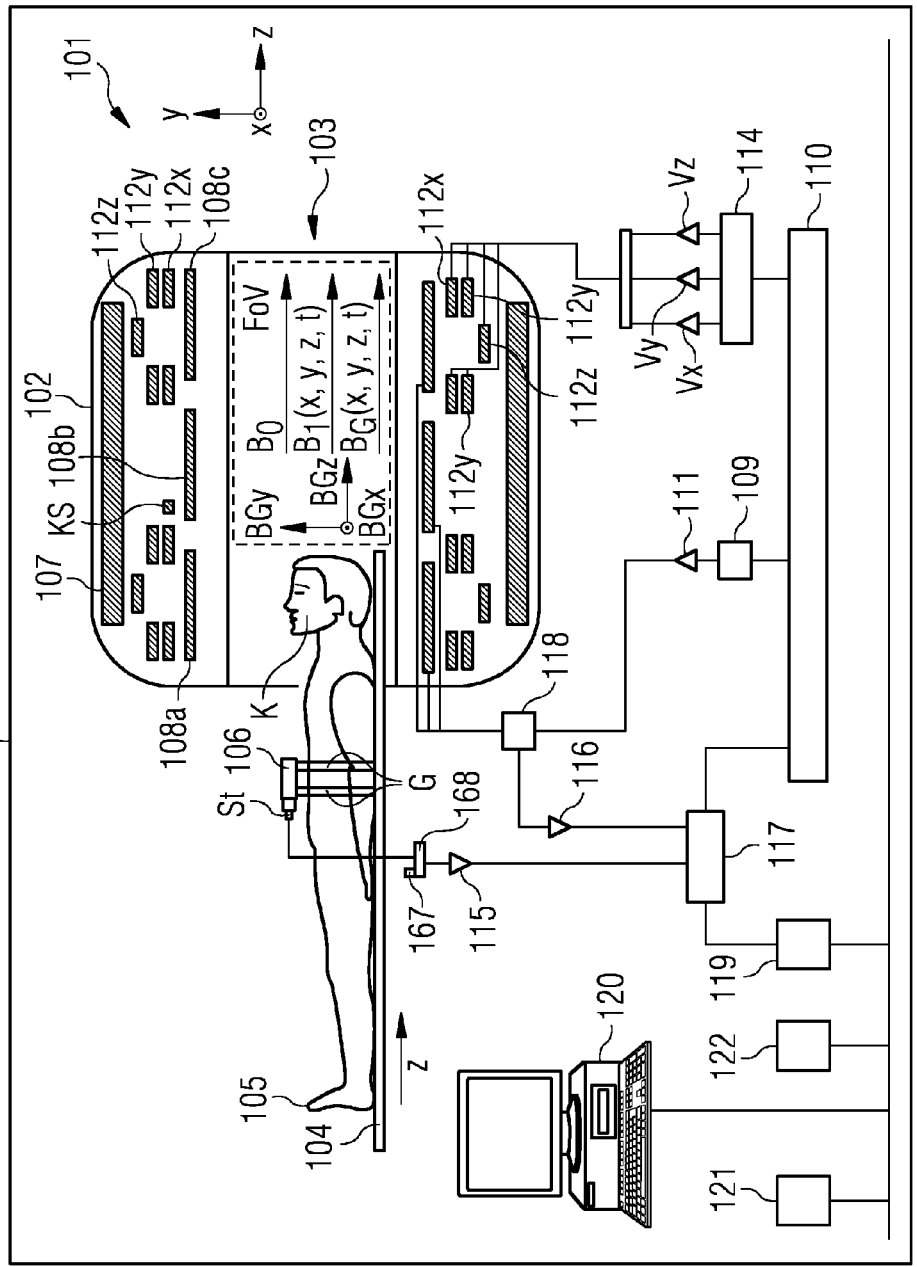
FIG. 6 shows a schematic diagram of one embodiment of a magnetic resonance tomography (MRT) system.

FIG. 6 shows one embodiment of an imaging magnetic resonance device MRT 101 (e.g., located in a shielded room or Faraday cage F) with a whole body coil 102 having, for example, a tubular space 103 into which a patient couch 104 with a body 105 (e.g., of an object to be examined such as a patient; with or without local coil arrangement 106) may be moved in the direction of the arrow z in order to generate images of the patient 105 by an imaging method. A local coil arrangement 106 is arranged on the patient, and in a local area (e.g., a field of view (FoV)) of the MRT, images of a part area of the body 105 may be generated in the FoV with the local coil arrangement 106. Signals of the local coil arrangement 106 may be evaluated (e.g., converted into images, stored or displayed) by an evaluation device (e.g., including elements 168, 115, 117, 119, 120, 121) of the MRT 101 that may be connected via coaxial cable or wirelessly (e.g., 167), for example, to the local coil arrangement 106.

In order to examine the body 105 (e.g., the object to be examined or the patient) with a magnetic resonance device MRT 101 using magnetic resonance imaging, different magnetic fields matched as exactly as possible to one another in temporal and spatial characteristic are irradiated onto the body 105. A strong magnet (e.g., a cryomagnet 107) in a measurement chamber with, for example, a tunnel-shaped opening 103 creates a statically strong main magnetic field $B_0$, that amounts, for example, to between 0.2 Tesla and 3 Tesla or even more. A body to be examined 105 is moved, supported on a patient couch 104, into a roughly homogeneous area of the main magnetic field B0 in the FoV area. An excitation of the nuclear resonance of atomic nuclei of the body 105 is brought about via magnetic high-frequency excitation pulses B1 (x, y, z, t) that may be irradiated via a high-frequency antenna shown in FIG. 6 very much simplified as a body coil 108 (e.g. a multipart body coil 108a, 108b, 108c; and/or possibly a local coil arrangement).

High-frequency excitation pulses are generated, for example, by a pulse generation unit 109 that is controlled by a pulse sequence control unit 110. After amplification by a high-frequency amplifier 111, the high-frequency excitation pulses are conveyed to the high-frequency antenna 108. The high-frequency system shown in FIG. 6 is merely indicated schematically. In other embodiments, more than one pulse generation unit 109, more than one high-frequency amplifier 111 and a number of high-frequency antennas 108 a, b, c are used in a magnetic resonance device 101.

The magnetic resonance device 101 also has gradient coils 112x, 112y, 112z, with which during a measurement, magnetic gradient fields $B_G(x, y, z, t)$ are radiated in for selective slice excitation and for local encoding of the measurement signal. The gradient coils 112x, 112y, 112z are controlled by a gradient coil control unit 114 (and possibly via amplifiers Vx, Vy, Vz) that, like the pulse generation unit 109, is connected to the pulse sequence control unit 110.

Signals transmitted by the excited nuclear resonance (e.g., of the atomic nuclei in the object under examination) are received by the body coil 108 and/or at least one local coil arrangement 106, amplified by assigned high-frequency preamplifiers 116 and further processed and digitized by a receiver unit 117. The recorded measurement data is digitized and stored as complex numerical values in a k-space matrix. An associated MR image is reconstructable from the k-space matrix occupied by values using a multidimensional Fourier transformation.

For a coil that may be operated both in transmit mode and also in receive mode, such as, for example, the body coil 108 or a local coil 106, the correct signal forwarding is regulated by an upstream transceiver switch 118.

An image processing unit 119 creates an image from the measurement data. The image is displayed via an operating console 120 to a user and/or is stored in a memory unit 121. A central processor unit 122 controls the individual system components.

In MR tomography, images with a high signal-to-noise ratio (SNR) may be recorded with local coil arrangements. The local coil arrangements are antenna systems that are attached in the immediate vicinity at (anterior), below (posterior), on, or in the body 105. During an MR measurement, the excited nuclei induce a voltage in the individual antennas of the local coil. The induced voltage is amplified by a low-noise preamplifier (e.g., LNA, preamp) and is forwarded to the receive electronics. To improve the signal-to-noise ratio even in high-resolution images, high-field systems are used (e.g., 1.5T-12T and more). If more individual antennas may be connected to an MR receive system than there are receivers available, a switching matrix (e.g., an RCCS) is integrated between receive antennas and receivers. This matrix routes the currently active receive channels (e.g., the receive channels that currently lie in the field of view of the magnet) to the available receivers. This makes it possible to connect more coil elements than there are receivers available, since for whole body coverage, the coils that are located in the FoV or in the homogeneity volume of the magnet are to be read out.

A local coil arrangement 106 may be an antenna system that includes one, or as an array coil, a number of antenna elements (e.g., coil elements), for example. These individual antenna elements are, for example, configured as loop antennas (e.g., loops), butterfly, flex coils or saddle coils. A local coil arrangement may include coil elements, a preamplifier, further electronics (e.g., sheath current filters), a housing, supports and may include a cable with plug, through which the local coil arrangement is connected to the MRT system. A receiver 168 attached to the system side filters and digitizes a signal received from a local coil 106 (e.g., wirelessly, and transfers the data to a digital signal processing device that mostly derives an image or a spectrum from the data obtained by a measurement and makes the image or the spectrum available to the user (e.g., for subsequent diagnosis by user and/or for storage).

FIGS. 1-4 respectively show one embodiment of a shim coil arrangement SAN with spacers AB. Through the spacers AB, shim coil arrangements SAN (e.g., each with a shim coil SP) may be held apart from one another at a defined and, for example, equal distance in each case in accordance with FIG. 5.

Figure 1:
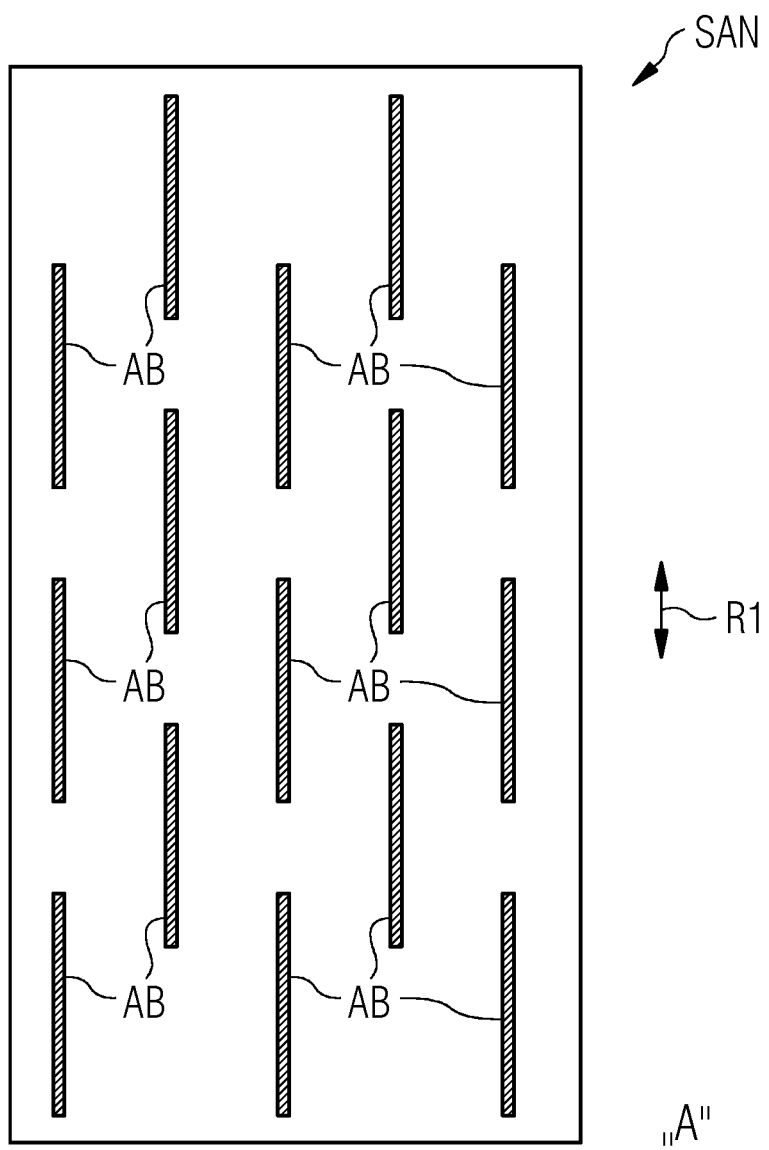
FIG. 1 shows a simplified overhead view of a first exemplary pattern structure "A" of an arrangement of spacers on a circuit board of a shim coil arrangement.

FIG. 1 shows a simplified schematic overhead view of a first sample structure "A" (i.e., the spatial design) of an arrangement of a number of spacers AB on an underside of a circuit board PL of a shim coil arrangement SAN not shown in detail in FIG. 1. The longitudinal axes of the longitudinal spacers AB of the shim coil arrangement SAN extend in parallel to one another in the same direction R1.

Figure 2:
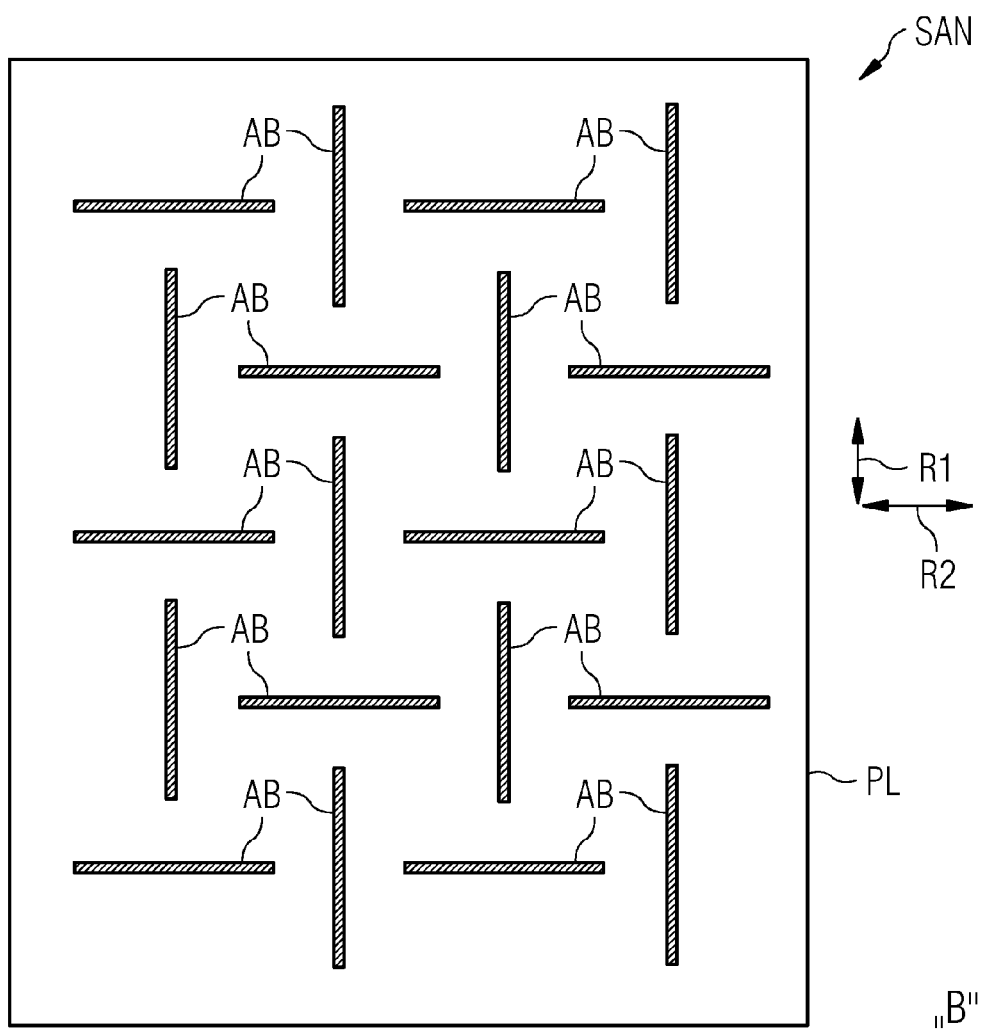
FIG. 2 shows a simplified overhead view of a second exemplary pattern structure "B" of an arrangement of spacers on a circuit board of a shim coil arrangement.

FIG. 2 shows a simplified schematic overhead view of a further sample structure "B" of an arrangement of a number of spacers AB on an underside of a circuit board PL of a shim coil arrangement SAN not shown in detail in FIG. 2. The longitudinal axes of the longitudinal spacers AB of the shim coil arrangement SAN (in the longitudinal directions) extend in two directions R1 and R2 orthogonal to one another.

Figure 3:
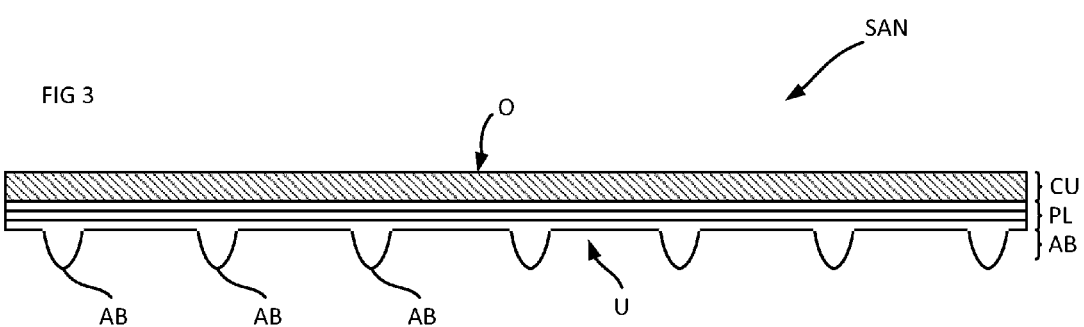
FIG. 3 shows a simplified cross-section through one embodiment of a shim coil arrangement with a circuit board with spacers before the etching of a copper layer of the circuit board to form a shim coil in the shim coil arrangement.

FIG. 3 shows a simplified cross-section through one embodiment of a shim coil arrangement SAN with a circuit board PL (e.g., made of epoxy glass laminate for example) with spacers AB before etching of the copper layer CU of the circuit board PL to form a shim coil (SP) in the copper layer CU on a side O of the shim coil arrangement SAN.

Figure 4:
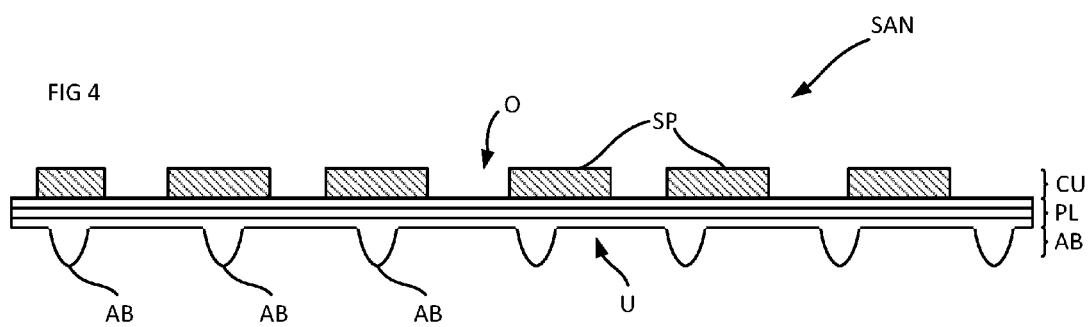
FIG. 4 shows a simplified cross-section through one embodiment of a shim coil arrangement with a circuit board with spacers after the etching of the copper layer of the circuit board to form a shim coil in the copper layer of the circuit board.

FIG. 4 shows a simplified cross-section through one embodiment of a B0 shim coil arrangement SAN with a circuit board PL (e.g., with spacers AB) after the etching of the copper layer CU of the circuit board PL to form a shim coil SP in the copper layer CU of the circuit board.

Figure 5:
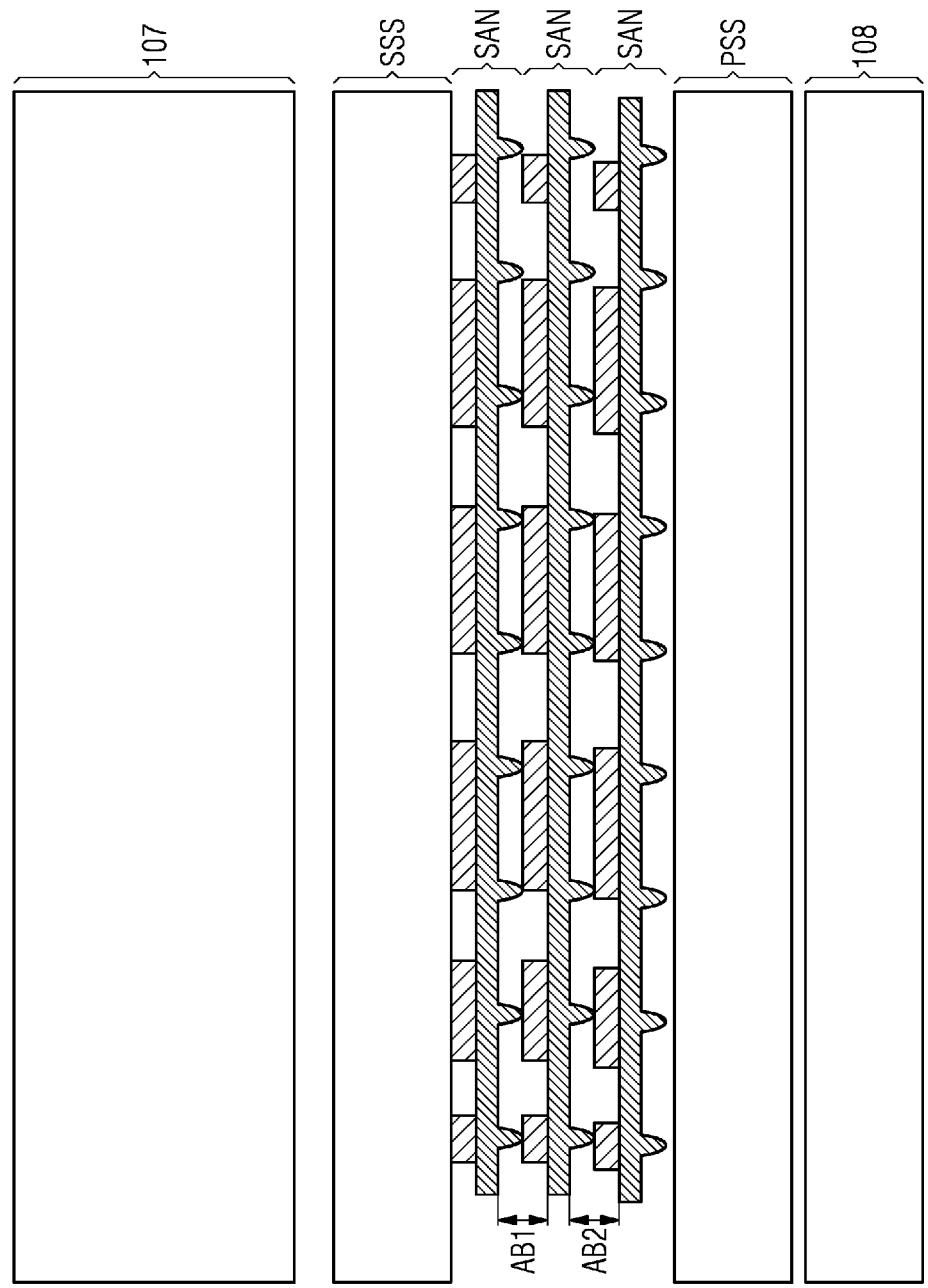
FIG. 5 shows a simplified cross-section through three exemplary shim coil arrangements layered one above the other with a same distances between the shim coil arrangements.

FIG. 5 shows, in a simplified and not true-to-scale diagram (e.g., between schematically indicated primary coils PSS (=112x, 112 y, 112 z) and secondary coils SSS), a cross-section through three exemplary B0 field shim coil arrangements SAN layered above one another with the same clear spaces AB1 and AB2 of the shim coil arrangements SAN of the active B0 shim system from one another (e.g., defined in copper layers by the spacers AB and/or the etched-on shim coils).

In the prior art, by using basic materials for printed circuit boards, on the side U lying opposite the copper-coated CU side O of the circuit board PL of the shim coil arrangement SAN, there is a smooth, non-structured surface U.

In accordance with an embodiment, the distance between the individual layers of shim coil arrangements SAN is provided in each case by a spacer AB molded onto an insulating/carrier plate PL (e.g., of the circuit board PL).

Despite the spacer AB, a shim coil layer SAN with shim coil(s) SP is able to be manufactured by process acts similar to those used in circuit board fabrication. For example, these process acts may include: mechanical processing of the outer contours; optional pre-treatment of the copper surface for improving the adhesion properties of the subsequent etch resist layer; application of an etch-resist lacquer: structured application using screen printing or digital printing, for example; surface application with subsequent exposure and stripping of the exposed/non-exposed areas (e.g., in accordance with whether a positive or negative resist is used); removal of the non-covered copper layer using etching methods; and optional removal (e.g., stripping) of the etch-resist layer.

The molded/integrated spacers AB may be manufactured, for example, using the following method: application using screen printing/template printing to the smooth rear side of the basic material and/or manufacturing as part of the pressing of the basic material in a process act similar to DE10246363, for example.

Possible benefits of one or more of the present embodiments may be: providing a very even, minimal and defined distance (AB1, AB2) between two (e.g., parallel and/or concentric) shim coil layers SP; providing a space-saving arrangement with the option of accommodating additional circuit board layers SAN in the restricted installation space available; and providing a method that saves time and money.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A shim coil arrangement for a magnetic resonance tomography system, the shim coil arrangement comprising:
   a printed circuit board comprising one side with a plurality of spacers integrated with the printed circuit board, and an opposite side coated with copper with at least one shim coil etched in the copper;
   wherein the plurality of spacers are configured to contact a shim coil of an adjacent shim coil arrangement.

2. The shim coil arrangement of claim 1, wherein the printed circuit board is made of an epoxy-glass laminate.

3. The shim coil arrangement of claim 1, wherein the printed circuit board has a smooth surface on at least one side of the printed circuit board.

4. The shim coil arrangement of claim 1, wherein the plurality of spacers is positioned on a side opposite to the one side coated with copper.

5. The shim coil arrangement of claim 1, wherein the plurality of spacers are positioned on a non-conducting side of the printed circuit board opposite to the side coated with copper.

6. The shim coil arrangement of claim 1, wherein at least two spacers of the plurality of spacers are configured longitudinally.

7. The shim coil arrangement of claim 1, wherein at least two spacers of the plurality of spacers extend in parallel to one another running in a same direction.

8. The shim coil arrangement of claim 1, wherein at least two spacers of the plurality of spacers extend in orthogonal directions to one another.

9. The shim coil arrangement of claim 1, wherein the plurality of spacers are molded onto the printed circuit board, are integrated on the printed circuit board, or are molded onto the printed circuit board and integrated on the printed circuit board.

10. The shim coil arrangement of claim 1, wherein the plurality of spacers are raised sections on a side of the printed circuit board.

* * * * *